US008971464B2

(12) United States Patent
Gandhi et al.

(10) Patent No.: US 8,971,464 B2
(45) Date of Patent: Mar. 3, 2015

(54) CREST FACTOR REDUCTION FOR SIGNALS WITH DYNAMIC POWER AND FREQUENCY DISTRIBUTION

(71) Applicant: Texas Instruments Incorporated, Dallas, TX (US)

(72) Inventors: Hardik Prakash Gandhi, Sunnyvale, CA (US); Zigang Yang, Plano, TX (US); Lars Jorgensen, Royal Oaks, CA (US); Prasad Chivakula, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 65 days.

(21) Appl. No.: 13/683,019

(22) Filed: Nov. 21, 2012

(65) Prior Publication Data

US 2014/0140452 A1    May 22, 2014

(51) Int. Cl.
*H03D 1/04*      (2006.01)
*H04B 1/04*      (2006.01)
*H04L 27/26*    (2006.01)

(52) U.S. Cl.
CPC .............. *H04B 1/0475* (2013.01); *H04L 27/26* (2013.01); *H04B 2001/0425* (2013.01)
USPC .......... 375/346; 375/297; 375/296; 370/350; 370/331

(58) Field of Classification Search
USPC ................... 375/297, 295, 296, 267; 330/149
See application file for complete search history.

(56) References Cited

U.S. PATENT DOCUMENTS

| 7,196,257 | B2 * | 3/2007 | Swick et al. ................... 84/460 |
| 7,486,738 | B2 | 2/2009 | Trivedi |
| 2004/0218689 | A1 * | 11/2004 | Akhtman ...................... 375/296 |
| 2005/0136859 | A1 * | 6/2005 | Anvari ........................ 455/114.3 |
| 2007/0217527 | A1 | 9/2007 | Rajagopal et al. |
| 2008/0247487 | A1 * | 10/2008 | Cai et al. ....................... 375/296 |
| 2011/0228872 | A1 | 9/2011 | Soler Garrido |
| 2011/0235760 | A1 | 9/2011 | Yu et al. |

* cited by examiner

*Primary Examiner* — Eva Puente

(74) *Attorney, Agent, or Firm* — Robert D. Marshall, Jr.; Frederick J. Telecky, Jr.

(57) ABSTRACT

A method to form a CFR cancellation filter for signals with dynamic power and frequency distribution by estimating the filter at the rate required by the input signal's dynamics. For mixed mode systems (for example CDMA and LTE) the CFR is computed for each stream, and combined to form the final filter.

8 Claims, 4 Drawing Sheets

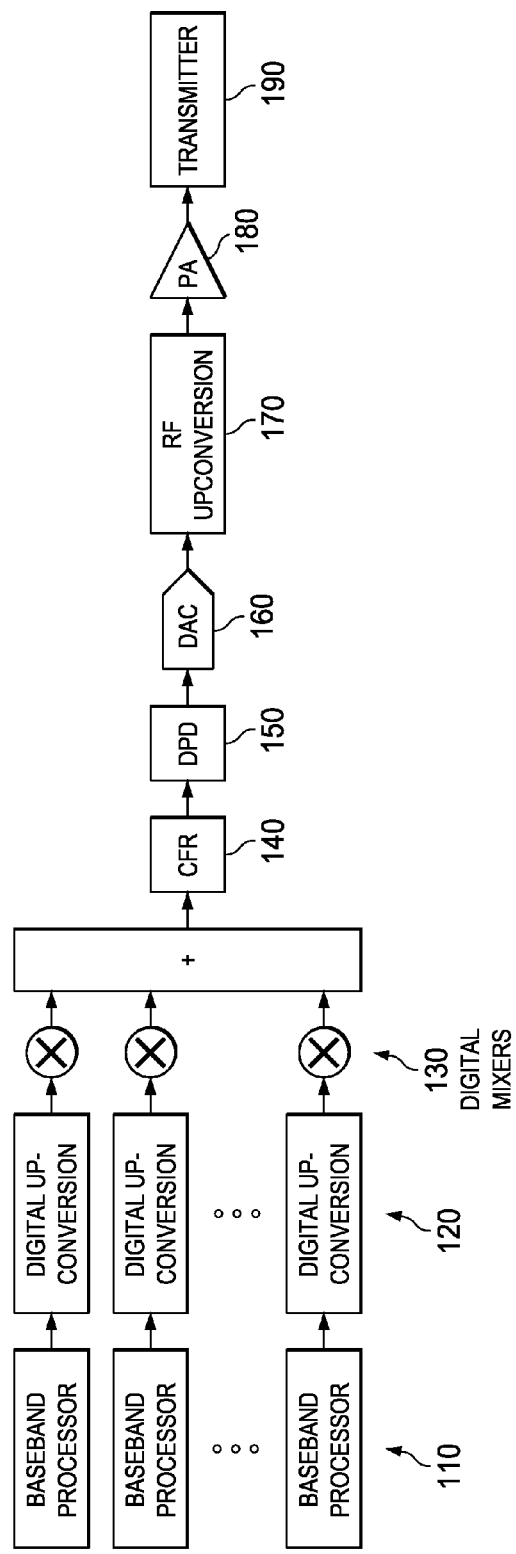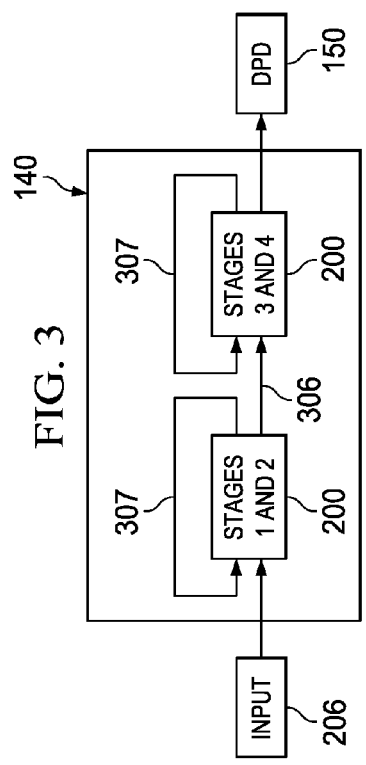

CREST FACTOR REDUCTION FOR SIGNALS WITH DYNAMIC POWER AND FREQUENCY DISTRIBUTION

TECHNICAL FIELD OF THE INVENTION

The technical field of this invention is digital signal processing.

BACKGROUND OF THE INVENTION

Higher order modulation wireless signals such as those used in CDMA (Code Division Multiple Access) or OFDM (Orthogonal Frequency Division Multiplexing) based communication systems have a high Peak to Average signal power Ratio (PAR). The higher peaks require the communication system to operate a Power Amplifier (PA) used to transmit the signal at less than an optimal power level because the higher signal peaks can cause the PA to max-out or saturate. To allow the power amplifier for a communication system to be driven harder and more efficiently, the peak to average ratio of the transmitted signals should be reduced while preserving the other characteristics of the signal such as modulation accuracy and spectral mask requirements.

Digital PAR reduction techniques typically involve injecting noise into the signal to cancel out the time domain signal peaks, thereby reducing the PAR. Traditionally, finite impulse response (FIR) filters are used to spectrally shape the cancellation noise before applying the cancellation noise to the signal. By so shaping the cancellation noise, spectral regrowth of the signal is prevented. The FIR filter should match the instantaneous spectrum of the composite multicarrier signal typical of transmit systems, otherwise mismatch between the time domain profiles of the signal peaks and the cancellation noise reduces the peak cancellation efficiency and will introduce out of spectrum emissions thus violating the emissions mask.

Multi-carrier communication signals requiring dynamic allocation of carrier frequencies, or dynamic scaling of carrier power, require the FIR filter coefficients to also be recomputed and updated on the fly. For dynamic signals like LTE, carrier power can change widely over bursts as short as 1 ms. Optimal PAR reduction can be obtained when the power distribution of the cancellation pulse matches the power distribution of the signal spectrum. In the absence of prior knowledge of the frequency hopping sequence or the power variations, for a communication signal, estimation of the new FIR filter coefficients to match the new carrier frequency allocations becomes a very hardware intensive problem.

SUMMARY OF THE INVENTION

Traditional crest factor reduction techniques used to improve power amplifier efficiency (like clip and filter) depend on introduction of specifically designed noise into the signal, such that the signal peaks are attenuated, while guaranteeing that all the introduced noise falls underneath the carrier spectrums only and does not violate spectral mask requirements (introducing some EVM degradation but little or no Adjacent Channel Power Ratio (ACPR) degradation).

To achieve this, filters that match the signal spectral characteristics exactly are designed off-line and stored in the Crest Factor Reduction (CFR) hardware. If the signal spectrum changes, the filters have to be re-designed else CFR may introduce cancellation noise in locations of the spectrum where there is no signal and violate the spectral mask. Also if the relative power levels of different carriers in a multi-carrier system change, the CFR filters need to be re-designed to add optimal noise under each carrier location (else low power carriers would have significantly higher amounts of Error Vector Magnitude (EVM) degradation than high power carriers and may exceed system budget, thus limiting CFR).

With the sheer number of different frequency and power level combinations possible, it would be very inefficient and expensive to pre-compute and store CFR filters for each combination in hardware. The rate of change of the signal characteristics prohibits updating the CFR filters with software interaction. Moreover, in applications like repeaters, there would not be any prior information available of the signal characteristics. In many current generation base-station and repeater systems, these problems limit the amount of CFR that can be applied to signals.

The solution implemented in this invention will help push CFR performance beyond current limits by providing a mechanism to automatically re-estimate the CFR cancellation filter in hardware based on signal characteristics, and in the case of repeaters, will enable using CFR where previously it could not be used, adding to significant system gains.

BRIEF DESCRIPTION OF THE DRAWINGS

These and other aspects of this invention are illustrated in the drawings, in which:

FIG. 1 shows a block diagram of a signal processing stream for a communication signal;

FIG. 3 shows a block diagram of an example multi-stage signal processor as configured in accordance with various embodiments of the invention;

DETAILED DESCRIPTION OF PREFERRED EMBODIMENTS

Figure 2:
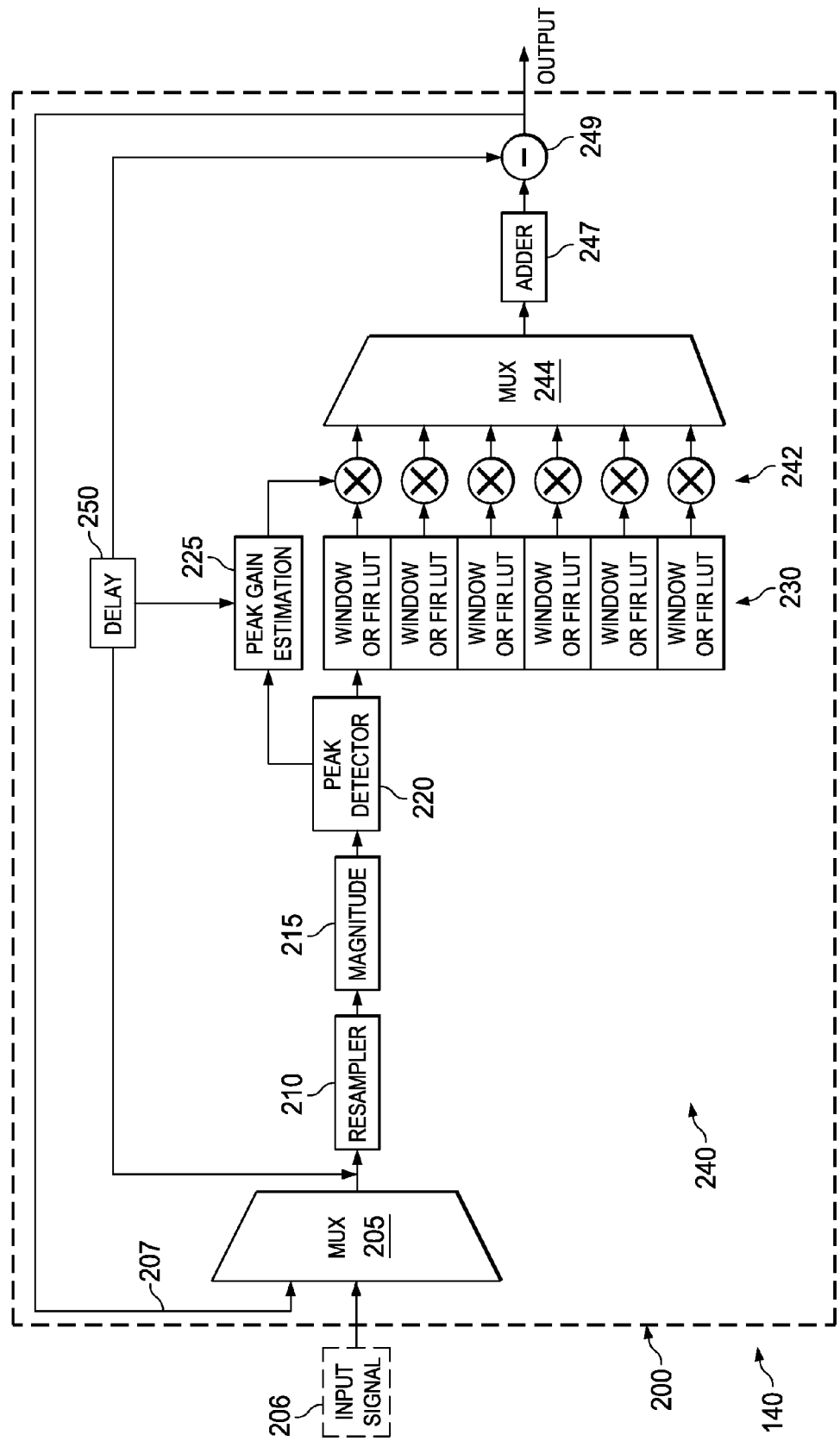
FIG. 2 shows a block diagram of an example signal processor capable of operating in various modes as configured in accordance with various embodiments of the invention.

Referring now to the drawings, and in particular to FIG. 1, a typical signal processing system for processing a communication signal will be described. A plurality of baseband processors 110 each create a digital baseband communication signal. Each baseband signal is passed to a digital up-conversion circuit 120 that converts the digital baseband signal into an over-sampled signal. The over-sampled signals are provided to a digital mixer circuit 130 that combines the over-sampled signals into a single composite input signal. The composite input signal is provided to a crest factor reduction circuit 140 that reduces some of the signal peaks relative to the average power of the input signal. The output of the crest factor reduction circuit 140 is provided to a digital pre-distortion circuit 150. The digital pre-distortion circuit 150 conditions the signal to increase the transmission efficiency of the signal. The digital pre-distorted signal is provided to a digital to analog converter circuit 160. The analog signal provided by the digital to analog converter circuit 160 is provided to an RF up-conversion circuit 170 that adjusts the frequency of the analog signal for transmission. The up-converted analog signal is provided to a power amplifier 180 that amplifies the signal for transmission by a transmitter 190. The transmitter 190 may send the communication signal either wirelessly or through a wired connection.

An example crest factor reduction circuit 140 will be described with reference to FIG. 2. A signal processor circuit 200 is adapted to operate in a finite impulse response mode. When operating in the finite impulse response mode, the signal processor circuit 200 uses cancellation pulse information derived from a finite impulse response filter. An example operation of the circuit under this mode will be described further below.

A delay circuit 250 is provided in the signal processor circuit 200 to control the processing timing of the input signal 206 and the processed input signal 207 as the data streams flow through the various elements of the signal processor circuit 200. In this example, the delay circuit 250 receives the input signal 206 and the processed input signal 207 information from the multiplexer 205 and provides those signals to the second processor element 225 and to the assembler 240 at the subtraction circuit 249.

The signal processor circuit 200 includes a multiplexer 205 adapted to receive an input signal 206 and a processed input signal 207. The multiplexer 205 combines the input signal 206 and the processed input signal 207 so that both signals may be processed at the same time by the described hardware. For instance, a first processor 210 has two or more processing streams to process information regarding both the input signal 206 and the processed input signal 207. The first processor 210 is adapted to receive the input signal 206 and the processed input signal 207 and is adapted to resample the input signal 206 and the processed input signal 207 at two or more sampling rates to identify signal peaks in the signals with increased time domain accuracy. The first processor 210 also determines signal peak location information for the signal peaks identified in the input signal 206 and the processed input signal 207. The signal peak information and signal peak location information is passed to a magnitude determination circuit 215. The magnitude determination circuit 215 is operatively coupled to the first processor 210 to determine magnitude information for the signal peaks. In various approaches, the magnitude determination circuit 215 may comprise a CORDIC circuit or a multiplier circuit, which are known in the art.

The second processor identifies signal peaks in a time range and provides a gain ratio for the signal peaks in the time range. In the example of FIG. 2, the second processor comprises two logic elements 220 and 225 wherein the first logic element 220 identifies signal peaks in the time range and the second logic element 225 provides the gain ratio for the signal peaks in the time range. Those skilled in the art will recognize and understand that such an apparatus 200, including the second processor 220 and 225, may be comprised of a plurality of physically distinct elements as is demonstrated by the illustration shown in FIG. 2. It is also possible, however, to view this illustration as comprising a logical view in which case one or more of these elements can be enabled and realized via a shared platform. It will also be understood that such a shared platform may comprise a wholly or at least partially programmable platform as is known in the art.

A memory circuit 230 is adapted to store and dynamically allocate cancellation pulse information to an input signal stream and to a processed input signal stream. An assembler 240 is adapted to combine the cancellation pulse information with the input signal and the processed input signal.

With reference to FIG. 3, the hardware for a signal processor circuit 200 may be used multiple times to reduce the amount of hardware used in a signal processing system. For example, the input signal 206 coming into an example crest reduction factor circuit 140 will be processed in a first stage by circuits such as that of FIG. 2. After being processed in the first stage, the processed input signal 307 is re-circulated through the same hardware to be reprocessed in a second stage thereby reducing additional signal peaks that still exist in a processed input signal. After the processed input signal 307 has been re-processed by the signal processor circuit 200 at the second stage, this doubly processed signal 306 may be provided to a second signal processor circuit 200. The signal 306 is then processed at a third stage as described herein to reduce additional signal peaks. After the third stage, the thrice processed signal 307 may be resent through the second signal processor circuit 200. This signal 307 is then processed for a fourth time at stage four. Accordingly, an input signal 206 can be processed four times to reduce multiple peak signals while using a reduced amount of hardware. Modifications to this multi-stage processing process can be made to match the requirements of a particular system.

So configured, a signal processor that processes a communication signal to reduce signal peaks in order to reduce a PAR may be controlled to reduce the likelihood of overcorrection caused by correcting multiple signal peaks in a short time window.

Prior art addresses this problem for a limited range of signal types (where the signal characteristics and spectral mask requirements were such that a limited amount of spectral leakage around the carrier could be tolerated).

That technique (windowing the signal around the peak to form the CFR cancellation filter) works well for static and hopping multi carrier GSM (Global System for Mobile Communications) signals. To tackle wider band signals like CDMA and LTE (Long Term Evolution) which exhibit similar frequency and power variations in the signals, but have tighter close-in spectral mask requirements, an alternate approach is demonstrated in this invention.

Figure 4:
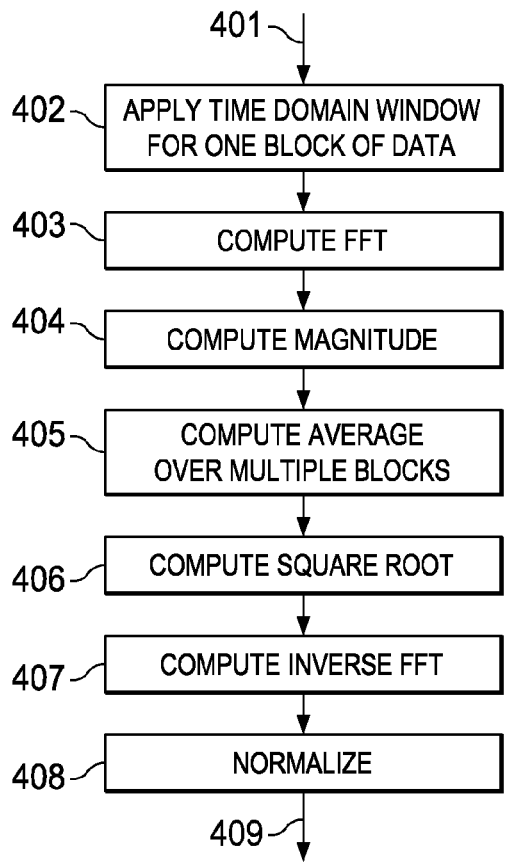
FIG. 4 shows a flow diagram of an example signal processing method as configured in accordance with various embodiments of the invention.

FIG. 4, shows the basic diagram for automatic filter generation. Snapshots of the pre-CFR signal 401 are taken periodically in hardware 402 and a Fast Fourier Transform (FFT) on the signal in 403. The magnitude square of the averaged transformed signal is computed in 404. In 405 multiples of such blocks are then averaged together and square root operation is performed on the resultant in 406. The result is then fed to Inverse FFT (IFFT) engine 407. The IFFT result is then connected to normalizer 408 which generates the time domain signal 409 which can now be used as the CFR filter.

Circuits 401 through 405 serve as an example of PSD (Power Spectral Density) calculation. This method of calculating PSD may be replaced with any other PSD calculation method.

Figure 5:
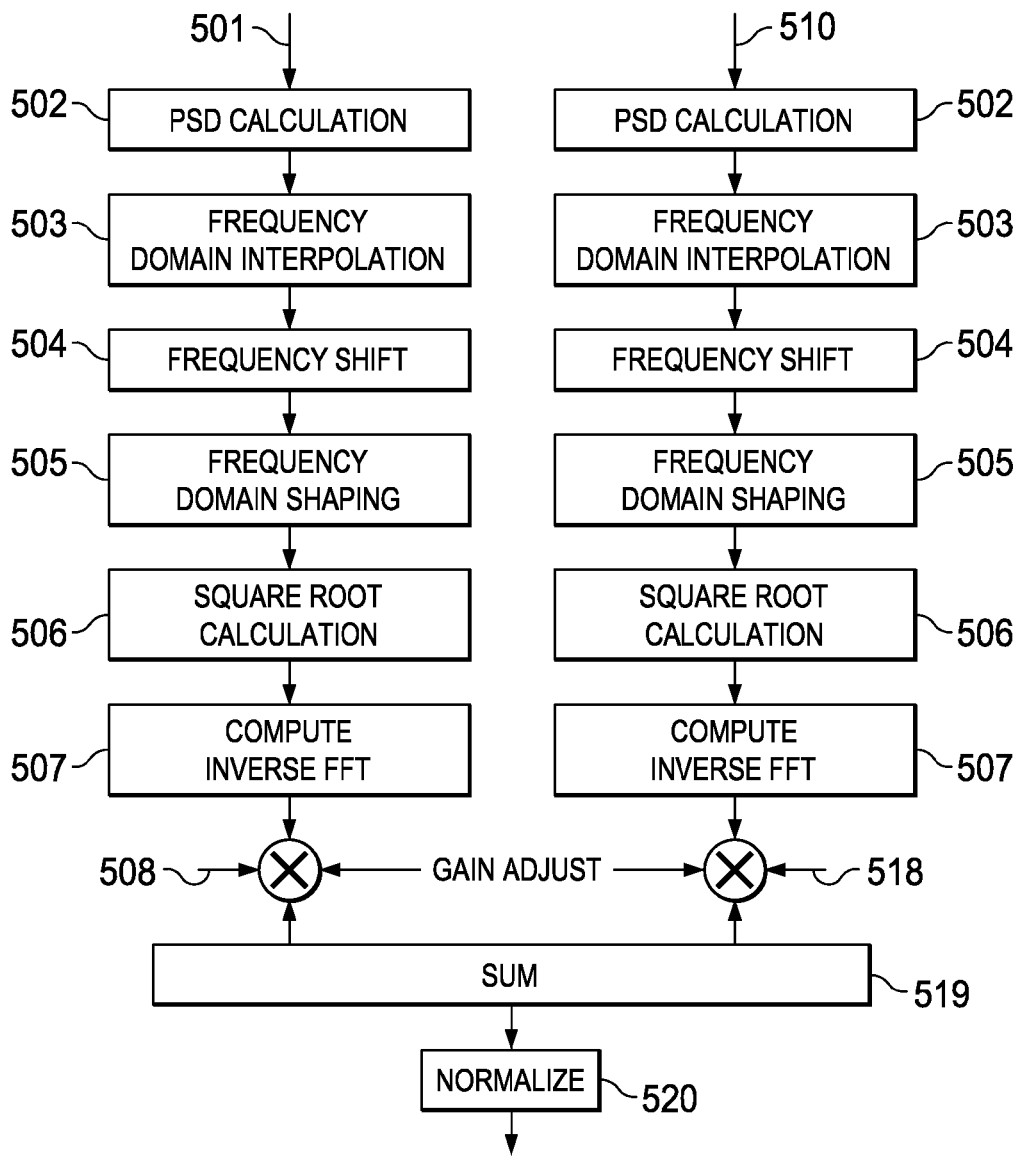
FIG. 5 shows a more detailed flow diagram of an example signal processing method as configured in accordance with various embodiments of the invention.

FIG. 5 shows an alternate implementation operating on multiple input streams 501 through 510. The PSD of the streams is calculated in step 502, followed by frequency interpolation in step 503, and frequency shifting in step 504. Interpolation and frequency shifting may be required, based on the type of the input stream. Some input signals—such as CDMA—require a sharper frequency response, and step 505 performs the required frequency domain shaping by applying a weighting factor as follows:

a=[a1, a2, a3, . . . , aN]
w=[w1, w2, w3, . . . , wN];
out=[a1*w1, a2*w2, . . . , aN*wN]; where
w is the weighting vector.

The square root of the signal is calculated in step 506. The frequency domain processing blocks 503, 504 and 505 can be placed either before or after the square root operation 506. The inverse FFT is computed in step 507.

The outputs of the inverse FFT steps are gain adjusted in steps 508 through 518 before being summed together in step 519 and normalized in step 520. Gain weighting is done on the individual streams to accommodate the different EVM requirements of the signals. As an example, CDMA requires lower EVM and LTE requires higher EVM. Accordingly the gain must be scaled up for CDMA and down for LTE when they are processed through the same power amplifier and antenna.

Figure 6:
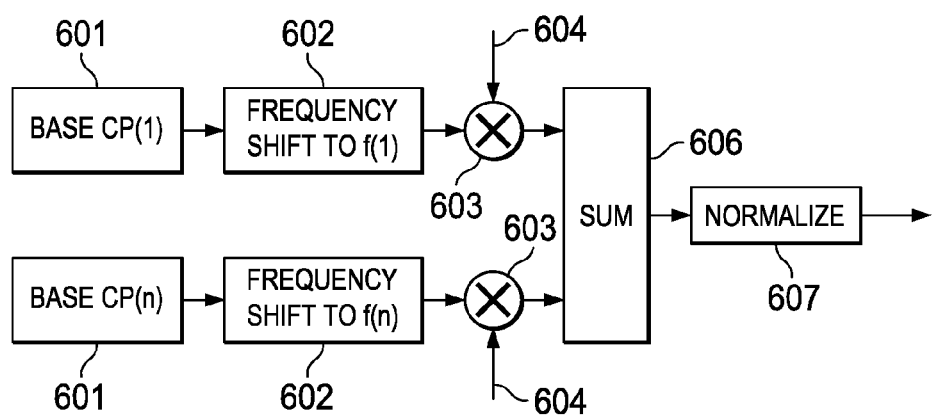
FIG. 6 shows an alternate embodiment of the invention.

FIG. 6 demonstrates an alternate embodiment of the invention. The base cancellation pulse for each carrier is stored in blocks 601 for each stream. The cancellation pulses are than frequency shifted to the stored frequency location of each carrier in blocks 602. The frequency shifted stream is then multiplied by the square root of the dynamically calculated power measurement of each carrier in multipliers 604, and the results are then summed in block 606. The result of block 604 is then normalized to yield the correct cancellation pulse.

These algorithm may be built into the hardware and would re-estimate the CFR filter (and update it to the datapath) at as fast a rate as determined by the signal dynamics. For example for LTE, an update rate of 100 us would suffice. The update rate can be traded off with the required hardware cost of the implementation. For mixed mode systems (for example LTE+CDMA) where the EVM requirements of the different signal types is different, this solution can estimate the CFR filter independently for the different carrier groups and then scale the results before combining to allow for different noise levels in different carrier types. The invention can support different filter lengths and windowing options that will result in an optimal hardware implementation for the FFT and IFFT blocks.

Those skilled in the art will recognize that a wide variety of modifications, alterations, and combinations can be made with respect to the above described embodiment without departing from the scope of the invention. For example, although the signal processing circuit it described herein as processing two signal streams, such a circuit may be modified to process one or more streams. Such modifications, alterations, and combinations are to be viewed as being within the inventive concept.

What is claimed is:

1. A method of computing a Crest Factor Reduction (CFR) filter, comprising the steps of:
   receiving an input signal;
   selecting a window of selectable length;
   computing a Fast Fourier Transform (FFT) on the input signal within the selected window;
   computing a magnitude square of the computed FFT results;
   computing an average of the magnitude squared using a selectable number of samples;
   computing a square root of the said averaged magnitude squared;
   computing an Inverse FFT of the said square root;
   normalizing the results of the Inverse FFT thus generating a CFR cancellation pulse; and
   applying the CFR cancellation pulse to the input signal.
2. The method of claim 1 wherein:
   said step of computing a FFT computes a 128 point FFT.
3. The method of claim 1 wherein:
   said step of computing a FFT computes a 256 point FFT.
4. The method of claim 1 wherein:
   said step of computing a FFT computes a 512 point FFT.
5. The method of claim 1 wherein:
   said step of computing the average of the magnitude squared results employs said selectable number of samples equal to an integral power of 2.
6. A method of computing a Crest Factor Reduction (CFR) filter, comprising the steps of:
   receiving a plurality of streams of input signals;
   computing a CFR cancellation pulse for each stream of input signals independently;
   scaling the plurality of CFR cancellation pulses to allow for varying noise levels of the inputs;
   combining the plurality of scaled CFR cancellation pulses; and
   computing a PSD (Power Spectral Density) of each stream of input signals by:
      periodically applying a time domain window to one block of data,
      computing a FFT (fast Fourier transform) to each of block of data,
      computing a magnitude square of the computed FFT results of the computed FFT of each block of data, and
      averaging the magnitude squared results over multiple blocks of data.
7. The method of claim 1 wherein:
   said step of computing the CFR cancellation pulse for each stream of input data independently includes
      frequency interpolating each stream of the input data and generating interpolated data,
      frequency shifting each stream of the interpolated data,
      shaping a frequency response of each stream of frequency shifted data by applying a weighting function as follows:
         a=[a1, a2, a3, . . . , aN]
         w=[w1, w2, w3, . . . , wN];
         out=[a1*w1, a2*w2, . . . , aN*wN]; where
         w is the weighting vector and a is the PSD;
      computing a square root of each stream of the frequency shaped data,
      computing an Inverse FFT of each stream of the square root data, and
      gain adjusting each stream of Inverse FFT data.
8. A method of computing a Crest Factor Reduction (CFR) filter, comprising the steps of:
   receiving a plurality of input signals;
   storing an initial cancellation pulse for a plurality of carriers;
   storing a frequency location of each carrier;
   frequency shifting said initial cancellation pulse to the stored frequency location of said carrier;
   dynamically measuring a power of said input signals;
   gain adjusting the frequency shifted cancellation pulses by the dynamically measured power of the corresponding input signal;
   summing the gain adjusted cancellation pulses;
   normalizing the summed cancellation pulses; and
   applying the normalized cancellation pulses to the input signals.

* * * * *